United States Patent
Bao

(10) Patent No.: US 9,379,240 B2
(45) Date of Patent: Jun. 28, 2016

(54) SEMICONDUCTOR DEVICE AND MANUFACTURING METHOD THEREOF

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventor: Wayne Bao, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 14/509,842

(22) Filed: Oct. 8, 2014

(65) Prior Publication Data
US 2015/0021673 A1 Jan. 22, 2015

Related U.S. Application Data

(62) Division of application No. 13/762,163, filed on Feb. 7, 2013, now Pat. No. 8,871,622.

(30) Foreign Application Priority Data

Sep. 20, 2012 (CN) .......................... 2012 1 0351667

(51) Int. Cl.
*H01L 29/78* (2006.01)
*H01L 29/66* (2006.01)
*H01L 29/06* (2006.01)
*H01L 21/8238* (2006.01)
*H01L 27/092* (2006.01)

(52) U.S. Cl.
CPC .... *H01L 29/7843* (2013.01); *H01L 21/823821* (2013.01); *H01L 27/0924* (2013.01); *H01L29/06* (2013.01); *H01L 29/66484* (2013.01); *H01L 29/66795* (2013.01); *H01L 29/78* (2013.01); *H01L 29/785* (2013.01)

(58) Field of Classification Search
CPC ............... H01L 21/823807; H01L 21/823821; H01L 29/785; H01L 29/66795; H01L 29/7843; H01L 27/1211; H01L 27/0924; H01L 29/66484; H01L 29/42384
USPC .................................... 257/288; 438/199.285
See application file for complete search history.

(56) References Cited

U.S. PATENT DOCUMENTS

2009/0095980 A1* 4/2009 Yu ..................... H01L 29/66795
257/190
2009/0280626 A1* 11/2009 Zhu ................... H01L 29/42384
438/479

(Continued)

FOREIGN PATENT DOCUMENTS

| CN | 101414632 | 4/2009 |
| CN | 103187439 | 7/2013 |
| CN | 103219366 | 7/2013 |

*Primary Examiner* — Kenneth Parker
*Assistant Examiner* — Bo Fan
(74) *Attorney, Agent, or Firm* — Innovation Counsel LLP

(57) ABSTRACT

A semiconductor device includes a substrate that has a surface. The semiconductor further includes a fin disposed on the surface and including a semiconductor member. The semiconductor further includes a spacer disposed on the surface, having a type of stress, and overlapping the semiconductor member in a direction parallel to the surface. A thickness of the spacer in a direction perpendicular to the surface is less than a height of the semiconductor member in the direction perpendicular to the surface.

20 Claims, 8 Drawing Sheets

(56) References Cited

U.S. PATENT DOCUMENTS

| | | |
|---|---|---|
| 2011/0306198 A1* | 12/2011 | Jeong et al. .................. 438/595 |
| 2012/0045878 A1* | 2/2012 | Tamura ......................... 438/285 |
| 2012/0070947 A1* | 3/2012 | Basker et al. ................. 438/197 |
| 2012/0129308 A1 | 5/2012 | Hoentschel et al. |
| 2012/0164803 A1 | 6/2012 | Chen et al. |
| 2012/0214295 A1 | 8/2012 | Liu |
| 2013/0295735 A1 | 11/2013 | Tsai et al. |

* cited by examiner

SEMICONDUCTOR DEVICE AND MANUFACTURING METHOD THEREOF

CROSS-REFERENCE TO RELATED APPLICATIONS

This application is a divisional application of U.S. application Ser. No. 13/762,163, filed on Feb. 7, 2013, which claims priority to and benefit of and Chinese Patent Application No. 201210351667.7, filed on Sep. 20, 2012 and entitled "Semiconductor Device and Manufacturing Method thereof", the prior applications being incorporated herein by reference.

BACKGROUND

1. Field of the Invention

The present invention relates to semiconductor device and manufacturing method thereof.

2. Description of the Related Art

For satisfying critical dimension (CD) requirements, fin semiconductor devices have been implemented. As an example, a fin field effect transistor (FinFET) may include a channel formed at a fin structure. On the other hand, for improving performance of semiconductor devices, stress devices that involve stress effects have been implemented.

SUMMARY

One or more embodiments of the invention may be related to a semiconductor device that includes a substrate having a surface. The semiconductor device may further include a first fin disposed on the surface and including a first semiconductor member. The semiconductor device may further include a first spacer disposed on the surface, having a first type of stress, and overlapping the first semiconductor member in a direction parallel to the surface. A thickness of the first spacer in a direction perpendicular to the surface may be less than a height of the first semiconductor member in the direction perpendicular to the surface.

In one or more embodiments, the semiconductor device may include a second fin disposed on the surface and including a second semiconductor member. The semiconductor device may further include a second spacer disposed on the surface, having a second type of stress that is different from the first type of stress, and overlapping the second semiconductor member in the direction parallel to the surface. A thickness of the second spacer in the direction perpendicular to the surface may be less than a height of the second semiconductor member in the direction perpendicular to the surface.

In one or more embodiments, the first fin may be associated with an N-type device part, and the second fin may be associated with a P-type device part. The first-type stress material may be a compressive stress material, and the second-type stress material may be a tensile stress material.

In one or more embodiments, the semiconductor device may include a gate enwrapping at least a portion of the first semiconductor member, at least a portion of the first spacer, least a portion of the second semiconductor member, and at least a portion of the second spacer.

In one or more embodiments, the first fin further includes a mask, and at least a portion of the mask is enwrapped by the gate and is disposed between the first semiconductor and a portion of the gate.

In one or more embodiments, the semiconductor device may include an insulating layer disposed on the surface and covering at least a portion of the first spacer. The semiconductor device may further include a third spacer overlapping the insulating layer in the direction perpendicular to the surface, overlapping the first spacer in the direction perpendicular to the surface, overlapping the first fin in the direction parallel to the surface, and having the second type of stress.

In one or more embodiments, the semiconductor device may include a fourth spacer overlapping the insulating layer in the direction perpendicular to the surface, overlapping the second spacer in the direction perpendicular to the surface, overlapping the second fin in the direction parallel to the surface, and having the first type of stress.

In one or more embodiments, the semiconductor device may include at least one of a first intermediate layer and a second intermediate layer. The first intermediate layer may be disposed between the third spacer and the first spacer and directly contacting at least one of the third spacer and the first spacer. The second intermediate layer may be disposed between the third spacer and the insulating layer and directly contacting at least one of the third spacer and the insulating layer.

In one or more embodiments, the semiconductor device may include an intermediate layer disposed between the first spacer and the first semiconductor member and directly contacting at least one of the first spacer and the first semiconductor member.

In one or more embodiments, the semiconductor device may include an insulating layer disposed on the surface and covering at least a portion of the first spacer. The semiconductor device may further include a second spacer overlapping the insulating layer in the direction perpendicular to the surface, overlapping the first spacer in the direction perpendicular to the surface, overlapping the first fin in the direction parallel to the surface, and having a second type of stress that is different from the first type of stress.

In one or more embodiments, the semiconductor device may include an insulating layer disposed on the surface and covering at least a portion of the first spacer. The semiconductor device may further include a gate enwrapping at least a portion of the first semiconductor member and overlapping at least a portion of the insulating layer in the direction perpendicular to the surface.

One or more embodiments of the invention may be related to a method for manufacturing a semiconductor device. The method may include providing a substrate that has a surface. The method may further include providing a first fin on the surface, the first fin including a first semiconductor member. The method may further include forming a first spacer on the surface, the first spacer having a first type of stress and overlapping the first semiconductor member in a direction parallel to the surface. A thickness of the first spacer in a direction perpendicular to the surface may be less than a height of the first semiconductor member in the direction perpendicular to the surface.

In one or more embodiments, the method may include providing a second fin on the surface, the second fin including a second semiconductor member. The method may further include forming a second spacer on the surface, the second spacer having a second type of stress that is different from the first type of stress and overlapping the second semiconductor member in the direction parallel to the surface. A thickness of the second spacer in the direction perpendicular to the surface may be less than a height of the second semiconductor member in the direction perpendicular to the surface.

In one or more embodiments, the method may include forming an insulating layer on the surface, the insulating layer covering at least a portion of the first spacer. The method may further include forming a third spacer, wherein the third spacer overlaps the insulating layer in the direction perpendicular to the surface, overlaps the first spacer in the direction perpendicular to the surface, overlaps the first fin in the direction parallel to the surface, and has the second type of stress.

In one or more embodiments, the method may further include forming a fourth spacer, wherein the fourth spacer overlaps the insulating layer in the direction perpendicular to the surface, overlaps the second spacer in the direction perpendicular to the surface, overlaps the second fin in the direction parallel to the surface, and has the first type of stress.

One or more embodiments of the invention may be related to a method for manufacturing a semiconductor device. The method may include providing a first fin and a second fin on a substrate. The method may further include disposing a first-type stress material on the substrate such that the first-type stress material covers the first fin and the second fin, a first portion of the first-type stress material corresponding to the first fin, a second portion of the first-type stress material corresponding to the second fin. The method may further include disposing a first resist pattern over the first-type stress material such that the first resist pattern covers the first portion of the first-type stress material without covering the second portion of the first-type stress material. The method may further include using the first resist pattern as a mask to remove the second portion of the first-type stress material. The method may further include removing the first resist pattern. The method may further include disposing a second-type stress material over the first portion of the first-type stress material and over the second fin, the second-type stress material being different from the first-type stress material, a first portion of the second-type stress material corresponding to the first fin, a second portion of the second-type stress material corresponding to the second fin. The method may further include disposing a second resist pattern over the second-type stress material such that the first resist pattern covers the second portion of the second-type stress material without covering the first portion of the first-type stress material. The method may further include using the second resist pattern as a mask to remove the first portion of the second-type stress material. The method may further include etching the first portion of the first-type stress material to form a first spacer at a first corner, the first corner being formed by the substrate and the first fin. The method may further include etching the second portion of the second-type stress material to form a second spacer at a second corner, the second corner being formed by the substrate and the second fin.

In one or more embodiments, the method may include, before the disposing the first resist pattern, disposing an intermediate layer on the first-type stress material, a first portion of the intermediate layer being corresponding to the first fin, a second portion of the intermediate layer corresponding to the second fin, wherein the resist pattern covers the first portion of the intermediate layer and exposes the second portion of the intermediate layer. The method may further include using the first resist pattern as a mask to remove the second portion of the intermediate layer.

In one or more embodiments, the method may further include disposing the first portion of the second-type stress material on the first portion of the intermediate layer. The method may further include using the second resist pattern as a mask to remove the first portion of the intermediate layer.

In one or more embodiments, the method may include forming a gate that enwraps at least a portion of the first fin, at least a portion of the first spacer, least a portion of the second fin, and at least a portion of the second spacer.

In one or more embodiments, the method may include disposing an insulating layer on the substrate such that the insulating layer covers at least a portion of the first spacer and at least a portion of the second spacer. The method may further include forming a gate that enwraps at least a portion of the first fin, enwraps at least a portion of the second fin, and overlaps at least a portion of the insulating layer.

In one or more embodiments, the method may include using the first fin to form an N-type device part. The method may further include using the second fin to form a P-type device part. The first-type stress material may be a compressive stress material, and the second-type stress material may be a tensile stress material.

One or more embodiments of the invention may be related to a semiconductor device that includes the following elements: a substrate with at least one fin formed on a surface thereof, the fin having a semiconductor layer; and a first spacer formed on a lower part of a sidewall of the at least one fin, a thickness of the first spacer being less than a height of the semiconductor layer in the at least one fin; wherein, the first spacer is formed of a first stress material of a first type of stress.

In one or more embodiments, the semiconductor device may further include the following elements: an insulating layer formed over the surface, the insulating layer covering at least a portion of the first spacer; and a second spacer formed on at least a portion of the sidewall of the at least one fin, over the insulating layer, and over the first spacer uncovered by the insulating layer if the first spacer uncovered by the insulating layer exists; wherein, the second spacer is formed of a second stress material having a second type of stress, the second type of stress is reverse, in nature, to the first type of stress.

In one or more embodiments, the at least one fin includes a first fin for forming a P-type device and a second fin for forming an N-type device, and wherein the first spacer for the first fin is formed of a tensile stress material, and the first spacer for the second fin is formed of a compressive stress material.

In one or more embodiments, the at least one fin includes a first fin for forming a P-type device and a second fin for forming an N-type device, and wherein the first spacer for the first fin is formed of a tensile stress material and the second spacer for the first fin is formed of a compressive stress material; the first spacer for the second fin is formed of a compressive stress material and the second spacer for the second fin is formed of a tensile stress material.

In one or more embodiments, the semiconductor device may include a gate formed over the surface, the gate enwrapping at least a portion of the semiconductor layer of the at least one fin.

In one or more embodiments, the semiconductor device may include a gate formed over the insulating layer and over the first spacer uncovered by the insulating layer if the first spacer uncovered by the insulating layer exists, the gate enwrapping at least a portion of the semiconductor layer of the at least one fin.

In one or more embodiments, the at least one fin may include a hard mask layer over the semiconductor layer.

In one or more embodiments, the substrate may include a semiconductor layer directly below the at least one fin.

In one or more embodiments, the semiconductor device may include an intermediate layer between the first spacer and the fin and/or between the first spacer and the surface of the substrate.

In one or more embodiments, the semiconductor device may include an intermediate layer between the second spacer and the fin.

One or more embodiments of the invention may be related to a method for manufacturing a semiconductor device. The method may include the following steps: providing a substrate with at least one fin formed on a surface thereof, the fin including a semiconductor layer; and forming a first spacer on a lower part of a sidewall of the at least one fin, the first spacer having a thickness less than a height of the semiconductor layer in the at least one fin; wherein, the first spacer is formed of a first stress material of a first type of stress.

In one or more embodiments, the method may include forming an insulating layer over the surface, the insulating layer covering at least a portion of the first spacer; and forming a second spacer on at least a portion of a sidewall of the at least one fin, over the insulating layer and the first spacer uncovered by the insulating layer if the first spacer uncovered by the insulating layer exists. The second spacer is formed of a second stress material of a second type of stress, and the second type of stress is reverse, in nature, to the first type of stress.

In one or more embodiments, the at least one fin includes a first fin for forming a P-type device and a second fin for forming an N-type device, the first spacer for the first fin is formed of a tensile stress material, and the first spacer for the second fin is formed of a compressive stress material.

In one or more embodiments, the at least one fin includes a first fin for forming a P-type device and a second fin for forming an N-type device. The first spacer for the first fin is formed of a tensile stress material, and the second spacer for the first fin is formed of a compressive stress material. The first spacer for the second fin is formed of a compressive stress material, and the second spacer for the second fin is formed of a tensile stress material.

In one or more embodiments, the method may include forming a gate over the surface, the gate enwrapping at least a portion of the semiconductor layer of the at least one fin.

In one or more embodiments, the method may include forming a gate over the insulating layer, the gate enwrapping at least a portion of the semiconductor layer of the at least one fin.

In one or more embodiments, the at least one fin may include a hard mask layer over the semiconductor layer.

In one or more embodiments, the substrate may include a semiconductor layer directly below the at least one fin.

In one or more embodiments, the method may include forming an intermediate layer on the sidewall of the at least one fin and/or on the surface of the substrate, prior to forming the first spacer, such that in the case where the first spacer is subsequently formed, the intermediate layer is between the first spacer and the fin and/or between the first spacer and the surface of the substrate.

In one or more embodiments, the method may include forming an intermediate layer on the sidewall of the at least one fin, prior to forming the second spacer, such that in the case where the second spacer is subsequently formed, the intermediate layer is between the second spacer and the fin.

According to embodiments of the present invention, carrier mobility in respective desired portions (e.g. a portion below a channel formation region between a source and a drain) of the n-type device and/or p-type device can be minimized using stress effect, and thus leakage between the source and the drain can be minimized. Additionally or alternatively, carrier mobility of the channel formation region can be enhanced, and thus device performance can be optimized.

Other features and advantages of the present invention will become apparent from the following detailed description in conjunction with the drawings.

BRIEF DESCRIPTION OF DRAWINGS

The accompanying drawings, which are incorporated in and constitute a part of the specification, illustrate embodiments of the invention and, together with the description, serve to explain the principles of the invention. By reading the following detailed description with reference to the accompanying drawings, the present invention can be better understood. In the drawings.

Figure 1:
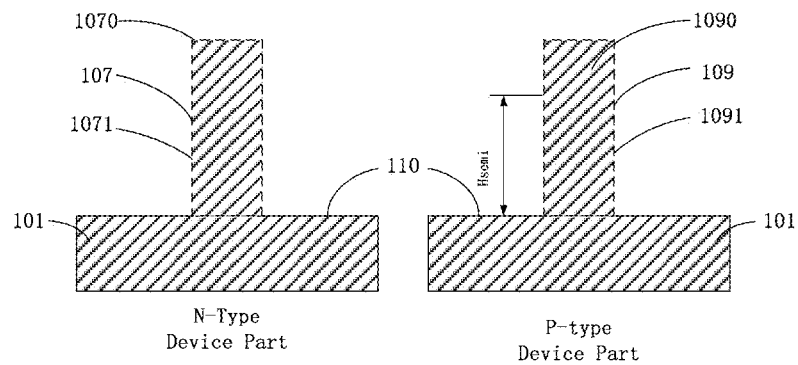
FIG. 1 illustrates a cross-sectional view of a semiconductor substrate and a fin formed on a surface of the semiconductor substrate according to one or more embodiments of the present invention.

It should be understood that, these drawings are illustrative and are not intended to limit the scope of the present invention. In the drawings, components may not have been drawn strictly to scale or shown according to their actual shapes. Some components (e.g. layers or parts) may be enlarged relative to others, so as to more clearly illustrate the principles of the present invention. Details that may obscure the gist of the present invention may not be shown in the drawings.

DESCRIPTION OF EMBODIMENTS

Hereinafter, embodiments of the present invention will be described in conjunction with the accompanying drawings.

As used herein, the term "semiconductor device" may be referred to a device that can operate partially or fully using semiconductor attributes.

Although the terms first, second, etc. may be used herein to describe various signals, elements, components, regions, layers, and/or sections, these signals, elements, components, regions, layers, and/or sections should not be limited by these terms. These terms may be used to distinguish one signal, element, component, region, layer, or section from another signal, region, layer or section. Thus, a first signal, element, component, region, layer, or section discussed below may be termed a second signal, element, component, region, layer, or section without departing from the teachings of the present invention. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

FIG. 1 illustrates a cross-sectional view of a semiconductor substrate 101 and at least one fin, for example, a fin 107 and a fin 109, formed on one or more surfaces of the semiconductor substrate 101 according to one or more embodiments of the present invention. Fins 107 and 109 can include semiconductor layers 1071 and 1091, respectively. Fins 107 and 109 can further include hard mask layers 1070 and 1090 disposed on the semiconductor layers 1071 and 1091, respectively. One of ordinary skill in the art can select materials for the semiconductor layers and the hard mask layers as appropriate. In one or more embodiments, there can be more or fewer fins. In one or more embodiments, the two fins can have one or more positional relations different from the relation illustrated in FIG. 1.

In one or more embodiments, the substrate 101 can be a bulk substrate, such as a bulk silicon substrate. In one or more embodiments, the substrate 101 can comprise a semiconductor layer directly below the at least one fin. The present invention is not limited to this configuration.

At least one of the fins can be used for forming an N-type device or a P-type device (such as an NMOS FinFET or a PMOS FinFET). In one or more embodiments, as illustrated in the figures, the fin 107 may be used for forming an N-type device, and the fin 109 may be used for forming a P-type device. The left part of the device illustrated in each figure of the figures can be referred to as an N-type device part (or N-type part for conciseness); the right part of the device illustrated in each figure of the figures can be referred to as a P-type device part (or P-type part for conciseness). It should be understood that the present invention is not limited to this arrangement.

Figure 2:
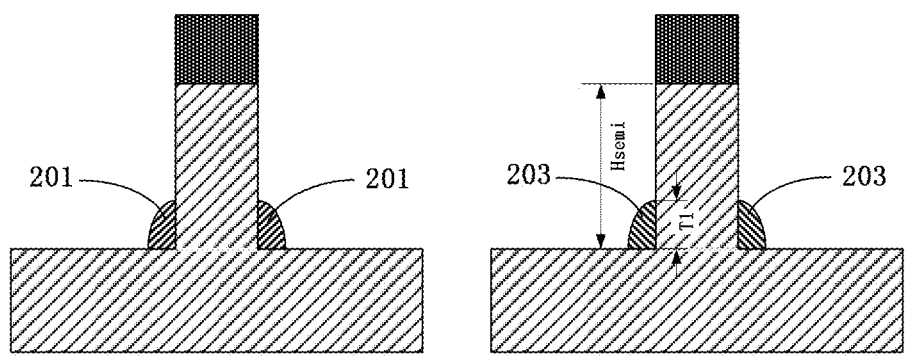
FIG. 2 illustrates a cross-sectional view of a semiconductor device according to one or more embodiments of the present invention, wherein a first spacer is formed on a lower part of a sidewall of the fin on the semiconductor substrate of FIG. 1.

FIG. 2 illustrates a cross-sectional view of first-layer spacers 201 and 203 (or first spacers 201 and 203 for conciseness) disposed on sidewalls of fins 107 and 109 on the semiconductor substrate 101 of FIG. 1 according to one or more embodiments of the present invention. As shown in FIG. 2, the first spacer(s) 201 can be formed on a lower part of a sidewall of fin 107 (at a corner formed by the fin 107 and the substrate 101), and the first spacer (s) 203 can be formed on a lower part of a sidewall of fin 109 (at a junction of the fin 109 and the substrate 101).

A first spacer for a particular fin can be formed of a first stress material having a particular first type of stress. For example, for fin 107, which is configured for forming an N-type device, the first spacer 201 may be formed of a compressive stress material (such as compressive stress silicon nitride). For fin 109, which is configured for forming a P-type device, the first spacer 203 may be formed of a tensile stress material (such as tensile stress silicon nitride).

The thickness (T1) of each of the first spacers 201 and 203 is less than the height (Hsemi) of the semiconductor layer in respective fins. In one or more embodiments, thickness T1 of at least one of the first spacers 201 and 203 may be ¾ or less than ¾ of the height of the semiconductor layer in associated fin(s). The top of first spacer, which may be buried under the STI dielectric, should be close to the bottom of the channel area. In one or more embodiments, the fin above STI dielectric is more than ¼ of the height of the semiconductor layer in associated fin(s). In one or more embodiments, the first spacer can have a thickness in a range of about 50 nm to 500 nm, which may be decided based on the height of the fin(s).

In one or more embodiments, a first spacer may directly contact the associated fin and may directly contact the underlying substrate, as illustrated in FIG. 2. In one or more embodiments, an intermediate layer can be formed between a first spacers (e.g., at least one of the first spacers 201 and 203) and the associated fin; for example, an intermediate layer may be disposed between the first spacer and the semiconductor layers in the associated fin. In one or more embodiments, an intermediate layer may be disposed between a first spacer and the substrate. One or more of the spacer-fin intermediate layer and the spacer-substrate intermediate layer may include a native oxide layer and/or one or more other functional layers. The intermediate layer(s) may not adversely affect the stress effect exerted by the spacer on the associated fin and/or the substrate.

FIGS. 5 to 10 illustrate cross-sectional views schematically showing a process for forming the first spacers according to one or more embodiments of the present invention.

Figure 5:
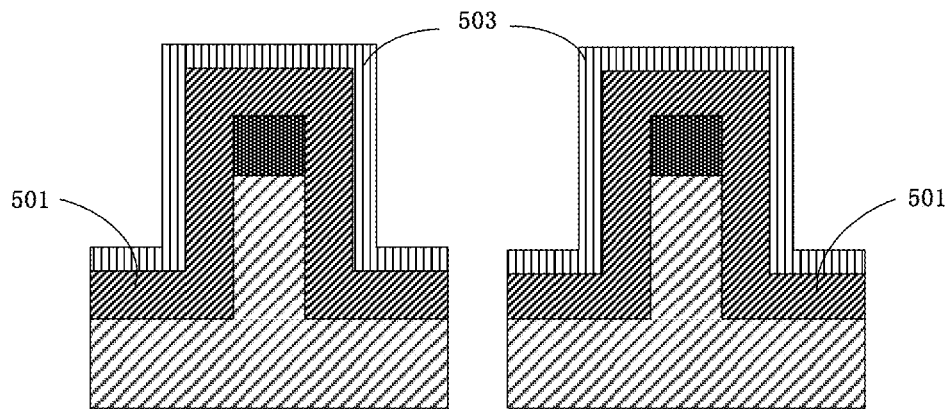
FIG. 5, FIG. 6, FIG. 7, FIG. 8, FIG. 9, and FIG. 10 schematically illustrate a process for forming the first spacer according to one or more embodiments of the present invention.

As illustrated in FIG. 5, a layer of compressive stress material 501 is formed on the substrate 101, on which fins 107 and 109 are formed. Thereafter, an intermediate layer 503 (e.g. silicon oxide layer) is formed on the layer of compressive stress material 501. In one or more embodiments, the compressive stress material 501 can be formed of compressive stress silicon nitride and can be formed using a chemical vapor deposition (CVD) process under the following process conditions: a temperature in a range of about 400° C. to 500° C., a pressure in a range of about 1 torr to 10 torr, a high-frequency power in a range of about 50 w to 200 w and a low-frequency power in a range of about 10 w to 100 w, an $SiH_4$ flow rate in a range of about 20 sccm to 200 sccm, an $NH_3$ flow rate in a range of about 200 sccm to 1500 sccm, an $H_2$ flow rate in a range of about 1000 sccm to 5000 sccm, and Ar gas flow rate in a range of about 1000 sccm to 5000 sccm. In some embodiments, the compressive stress material may have a compressive stress in a range of about −4.0 GPa to −1.0 GPa, wherein the range may be determined according to process limitations, wherein a high compressive stress may be preferred, and wherein the notation "−" represents compressive stress. The high-frequency power and the low-frequency power may be applied during the process of film deposition by different generators. The low-frequency power can increase compressive stress by bombardment.

Figure 6:
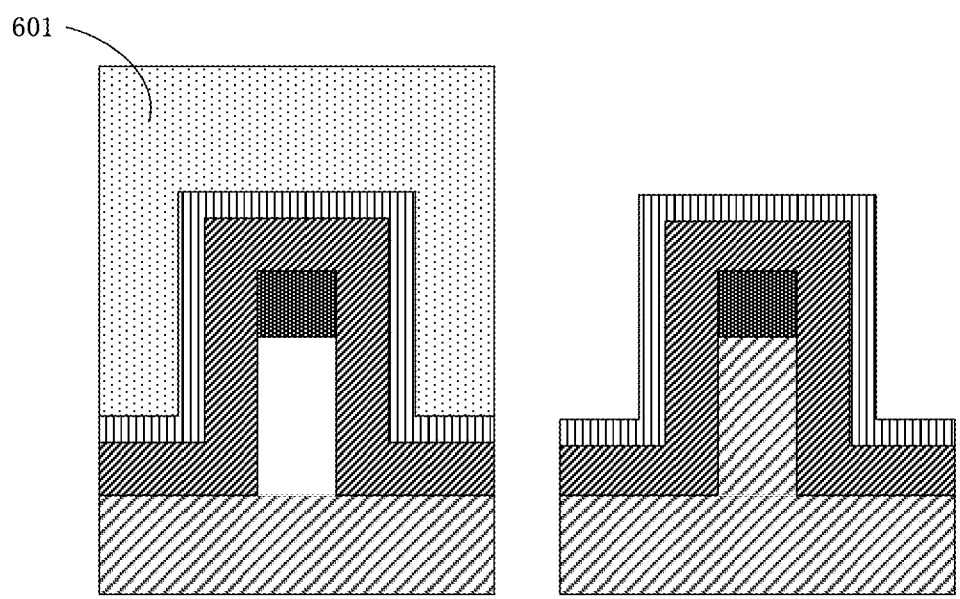
Figure 7:
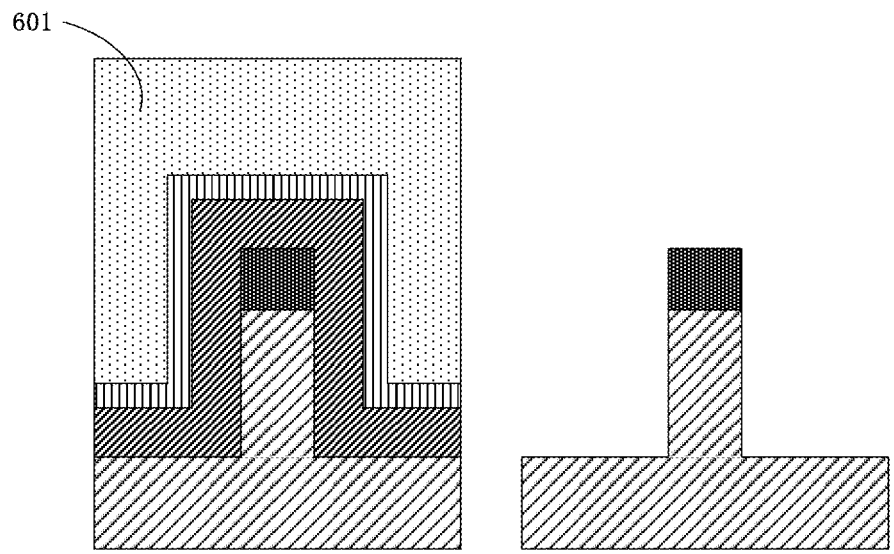

Next, as illustrated in FIG. 6, a resist pattern 601 is formed on the intermediate layer 503 so as to cover the N-type device part while exposing the P-type device part. Next, the intermediate layer 503 and the layer of compressive stress material 501 in the P-type device part are removed with the resist pattern 601 being used as a mask, as illustrated in FIG. 7.

Figure 8:
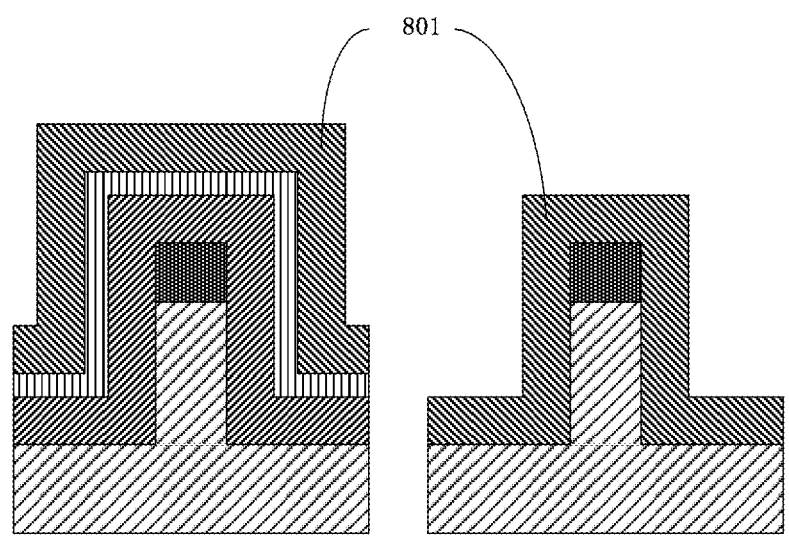

Thereafter, as illustrated in FIG. 8, after removing of the resist pattern 601, a layer of tensile stress material 801 is deposited on the substrate 101. As illustrated in FIG. 8, the layer of tensile stress material 801 is formed on both the N-type device part and the P-type device part. In one or more embodiments, the tensile stress material 801 can be formed of tensile stress silicon nitride and can be formed using a CVD process under the following process conditions: a temperature in a range of about 300° C. to 500° C., a pressure in a range of about 1 torr to 10 torr, a high-frequency power in a range of about 50 w to 300 w, an $SiH_4$ flow rate in a range of about 20 sccm to 200 sccm, an $NH_3$ flow rate in a range of about 200 sccm to 1500 sccm, and an $N_2$ flow rate in a range of about 500 sccm to 5000 sccm. In some embodiments, the tensile stress material can have a tensile stress in a range of about 0.8 GPa to 2.0 GPa, wherein the range may be determined based on process limitations, and wherein a high tensile stress may be preferred.

Figure 9:
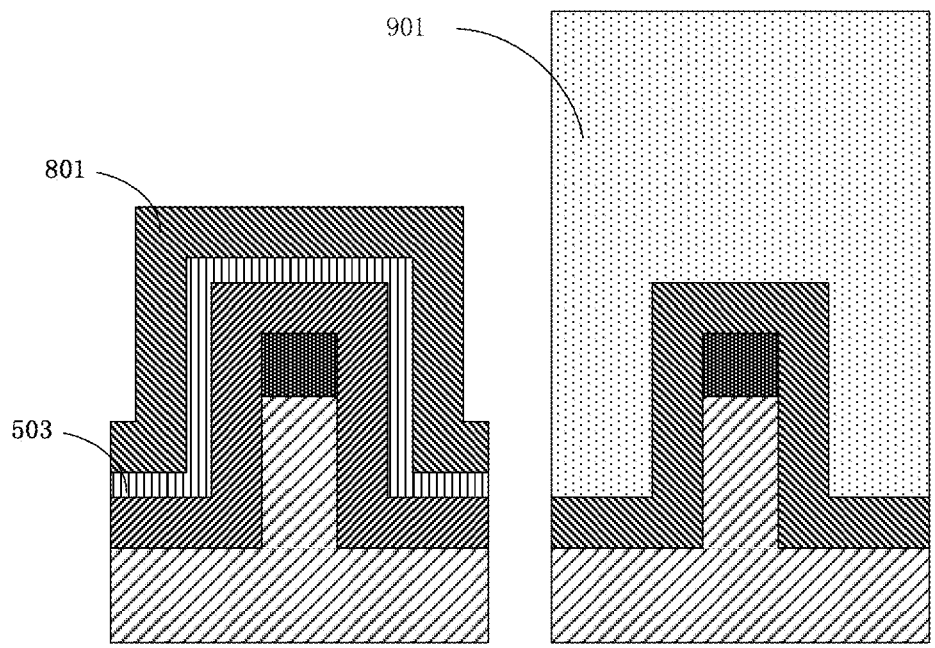
Figure 10:
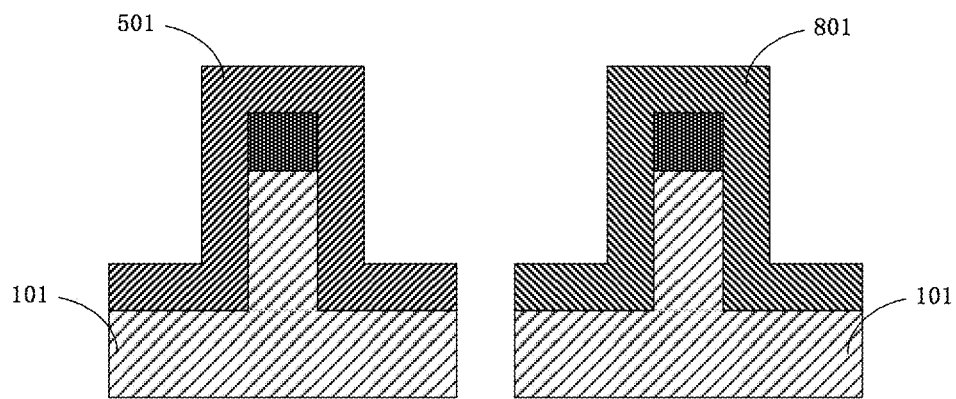

Subsequently, as illustrated in FIG. 9, a resist pattern 901 is formed so as to cover the P-type part. Thereafter, the layer of tensile stress material 801 and the intermediate layer 503 in the N-type part are removed with the resist pattern 901 being used as a mask, as illustrated in FIG. 10.

Thereafter, the thus formed stress material layers 801 and 501 are etched, thereby forming the first spacers 201 and 203, as illustrated in FIG. 2.

Figure 11:
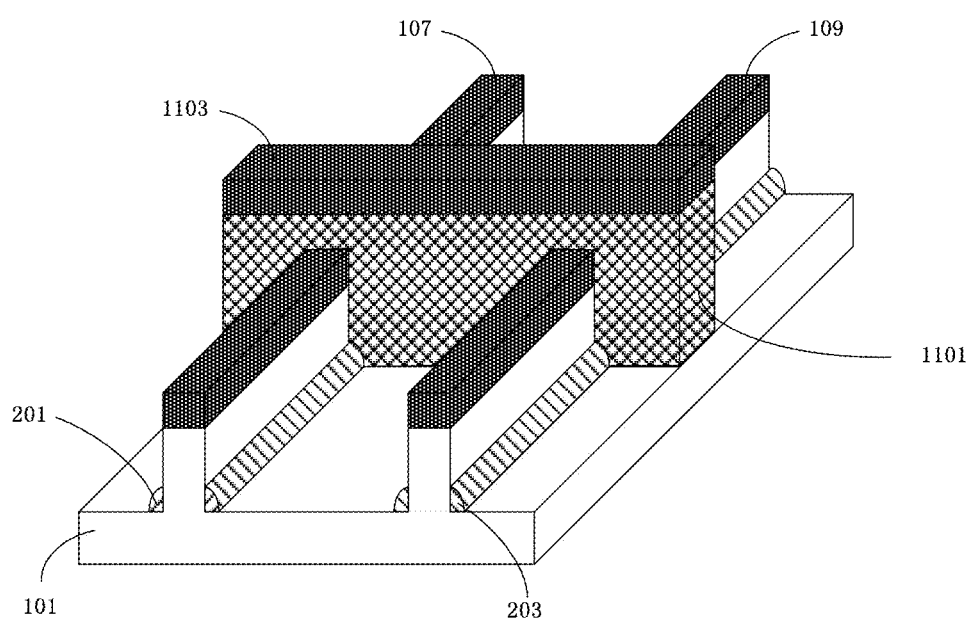
FIG. 11 illustrates a perspective view of a semiconductor device in which a gate is formed after the formation of the first spacer according to one or more embodiments of the present invention.

FIG. 11 illustrates a perspective view of a semiconductor device in which a gate is formed after the formation of the first spacers according to one or more embodiments of the present invention. After the structure as illustrated in FIG. 2 has been formed, a gate 1101 can be formed on the surface 110 of the substrate on which the fins are formed, and the gate 1101 enwraps at least a portion of the fins, as illustrated in FIG. 11. The gate 1101 can be formed with use of the technologies known in the art, and thus details thereof are omitted. In one or more embodiments, as illustrated in FIG. 11, the gate 1101 may have a hard mask 1103 thereon. In one or more embodiments, that the semiconductor device may not include the hard mask 1103 or a hard mask disposed on the gate 1101. As would be appreciated by one of ordinary skill in the art, a source and a drain can be formed in the fins in a self-aligned manner after the formation of the gate 1101.

According to one or more embodiments of the present invention, carrier mobility in desired portions (e.g., the portion below the channel formation region between the source and the drain) of the N-type device and/or P-type device can be minimized by stress effects associated with the spacers. Advantageously, leakage between the source and the drain can be minimized.

Figure 3:
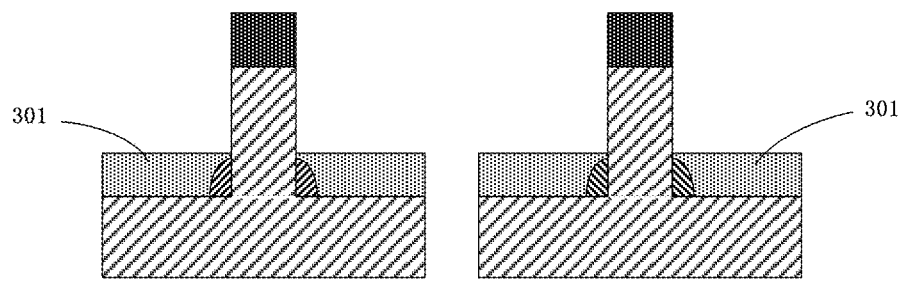
FIG. 3 illustrates a cross-sectional view of a semiconductor device according to one or more embodiments of the present invention, wherein, after formation of the first spacer, an insulating layer covering at least a portion of the first spacer is formed on the surface of the semiconductor substrate.

FIG. 3 illustrates a cross-sectional view of a semiconductor device according to one or more embodiments of the present invention, wherein, after formation of the first spacers 201 and 203 illustrated in FIG. 2, an (electrically) insulating layer 301 is formed on the surface 110 of the semiconductor substrate 101 so as to cover at least a portion of the first spacers 201 and 203. In one or more embodiments, after the first spaces 201 and 203 have been formed, insulating material, such as silicon oxide, can be deposited over the surface 110 of the substrate 101 (on which the fin is formed); subsequently, the deposited insulating layer can be etched back so as to form the insulating layer 301. Etching back of this insulating layer can be controlled such that the upper surface of the insulating layer 301 is substantially flush with or higher than the top of the first spacers 201 and 203, for facilitating subsequent processes. In one or more embodiments, the upper surface of the insulating layer 301 may be lower than the top of the first spacers 201 and 203. The insulating layer 301 can substantially cover at least portions of the first spacers 201 and 203.

Figure 4:
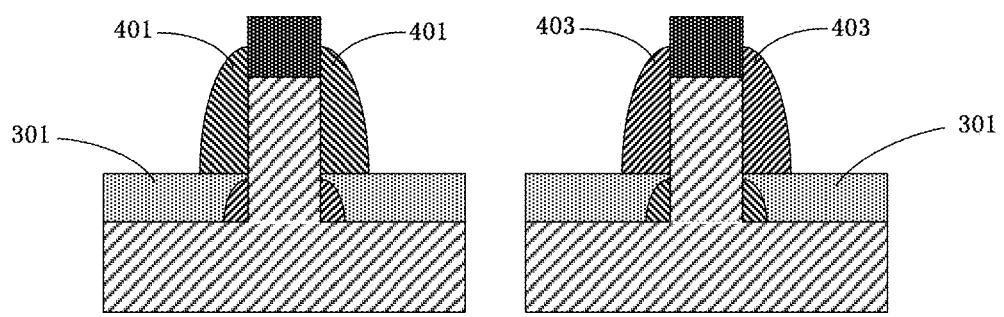
FIG. 4 illustrates a cross-sectional view of a semiconductor device according to one or more embodiments of the present invention, wherein a second spacer is formed over the insulating layer and the first spacer (if the first spacer exists).

Thereafter, as illustrated in FIG. 4, second-layer spacers 401 and 403 (or second spacers 401 and 403 for conciseness) are formed on at least portions of the sidewalls of the fins. These second spacers are formed over the insulating layer 301 (and may also be formed over portions of the first spacers not covered by the insulating layer). In one or more embodiments, the second spacers may be formed of one or more stress materials. For a particular fin, the associated second spacer can be formed of a second stress material of a second type of stress that is reverse, in nature, to the first type of stress of the first spacer associated with this fin.

For example, in the N-type device part, that is, for the fin 107 for forming the N-type device, the second spacer 401 may be formed of a tensile stress material, while the first spacer 201 may be formed of a compressive stress material. As another example, in the P-type device part, that is, for the fin 109 for forming the P-type device, the second spacer 403 may be formed of a compressive stress material, while the first spacer 203 may be formed of a tensile stress material. Analogous to the first stress materials, the second stress materials can be compressive stress silicon nitride and/or tensile stress silicon nitride.

A method analogous to the method described above with reference to FIGS. 5 to 10 as well as the process conditions set forth above can be employed in forming the second spacers 401 and 403.

In one or more embodiments, there may be no specific limitations on the thickness or the height of the second spacers 401 and 403. In one or more embodiments, the height of at least one of the second spacers 401 and 403 can be in a range from ¼ of the height of the semiconductor layer (s) in the associated fin (s) to the height of the semiconductor layer in the associated fin(s). The top of first spacer, which may be buried under the STI dielectric, should be close to the bottom of the channel area. In one or more embodiments, the fin above STI dielectric is more than ¼ of the height of the semiconductor layer in associated fin(s). In one or more embodiments, as illustrated in FIG. 4, the second spacers can be formed up to and can contact (and overlap) the two sides of the associated hard masks of the respective associated fins. In one or more embodiments, the second spacer can have a height in a range from 200 nm to 500 nm.

In one or more embodiments, the second spacers may directly contact the associated fins, as illustrated in FIG. 4. In one or more embodiments, there can be one or more intermediate layers, such as a native oxide layer and/or one or more other functional layers, between a second spacer and the associated fin. In one or more embodiments, the intermediate layer(s) may not adversely affect the stress effect exerted by the spacer on the associated fin.

According to some embodiments of the present invention, carrier mobility in respective desired portions (e.g. the portion below the channel formation region between the source and the drain) of the N-type device and/or P-type device can be minimized by the stress effect, and thus leakage between the source and the drain can be minimized. Additionally or alternatively, carrier mobility of the channel formation region can be enhanced, and thus device performance can be optimized.

Figure 12:
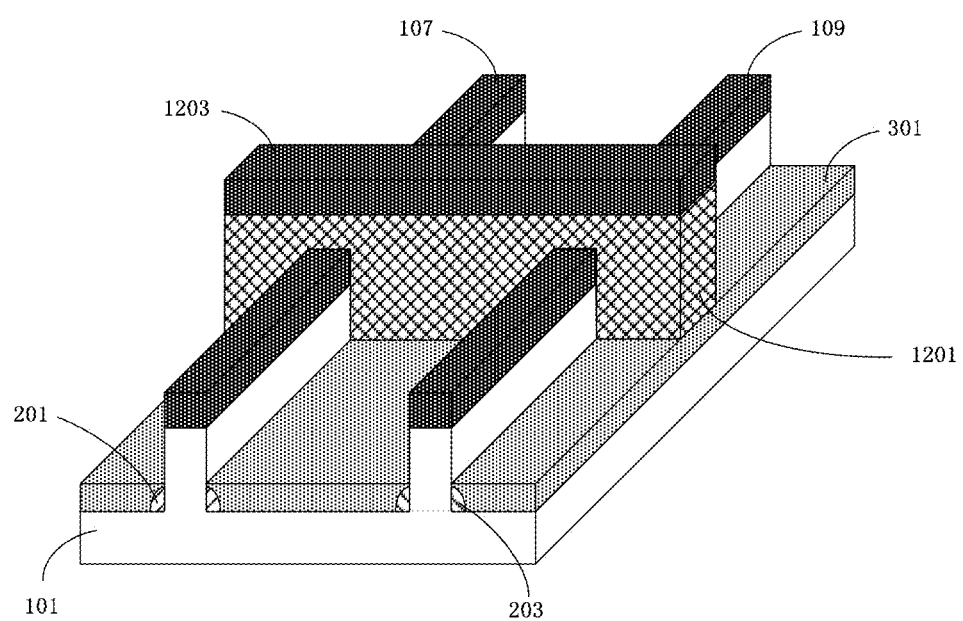
FIG. 12 illustrates a perspective view of a semiconductor device in which a gate is formed after the formation of the insulating layer according to one or more embodiments of the present invention.

FIG. 12 illustrates a perspective view of a semiconductor device in which a gate 1201 is formed after the forming of the insulating layer 301 illustrated in FIG. 3 according to one or more embodiments of the present invention. After the formation of the insulating layer 301, gate 1201 can be formed over the insulating layer 301 (and can also be formed over portions of the first spacer not covered by the insulating layer 301). The gate 1201 enwraps at least a portion of the fins. The gate 1201 may include features analogous to features of the above-described gate 1101. In one or more embodiments, a source and a drain can be formed in the fins in a self-aligned manner, after the formation of the gate 1201.

Figure 13:
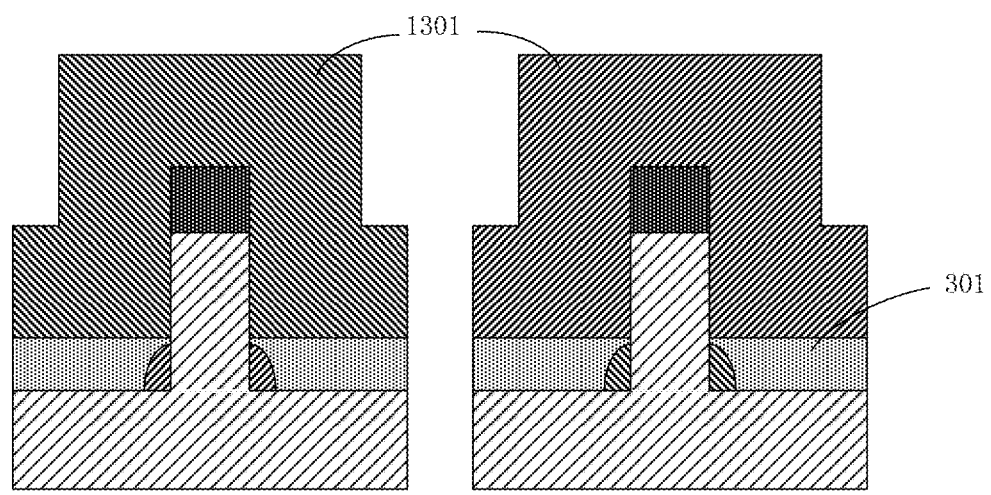
FIG. 13 illustrates a cross-sectional view of a semiconductor device for explaining a step of forming a second spacer according to one or more embodiments of the present invention.

Thereafter, by means of a method analogous to that discussed with reference to FIGS. 5 to 10, a layer of tensile stress material 1301 and a layer of compressive stress material 1303 can be formed respectively in the N-type device part and in the P-type device part, over the insulating layer (and over portions of the first spacers not covered by the insulating layer), as illustrated in FIG. 13. Subsequently, the layer of tensile stress material 1301 and the layer of compressive stress material 1303 are etched so as to form the second spacers 401 and 403 illustrated in FIG. 4.

In one or more embodiments, the second spacers 401 and 403 may be formed after formation of the gate 1201 on the insulating layer 301. In some embodiments, the gate can be formed on desired portions of the fins (such as the channel formation region) after the second spacers have been formed to exert stress for the fins and have been subsequently removed from the desired portions of the fins.

In one or more embodiments, as described above, at least an intermediate layer may be formed between at least one first spacer (201 and/or 203) and (the semiconductor layer) of at least one fin and/or between the first spacers (201 and 203) and the substrate. The method for manufacturing the semiconductor device may comprise a step of forming an intermediate layer on the sidewall of the at least one fin and/or on the surface of the substrate before forming the at least one first spacer. The first spacer may be subsequently formed. The intermediate layer may be disposed between the first spacer and the semiconductor layer and/or between the first spacer and the substrate surface. The intermediate layer may be formed on (and may contact) the sidewall of the fin and/or on the surface 110 of the substrate, and the first spacer may be formed on (and may contact) the intermediate layer.

In one or more embodiments, as described above, at least an intermediate layer can be formed between at least one second spacer (401 and/or 403) and at least one fin. The method for manufacturing the semiconductor device may comprise a step of forming an intermediate layer on the sidewall of the at least one fin before forming the at least one second spacer. The second spacer may be subsequently formed. The intermediate layer may be disposed between the second spacer and the semiconductor layer. The intermediate layer may be formed on (and may contact) the sidewall of the fin, and the second spacer may be formed on (and may contact) the intermediate layer.

Embodiments of the present invention have been described above with reference to the accompanying drawings. It should be understood that these embodiments are illustrative. The embodiments of the present invention can be combined and/or altered. One of ordinary skill in the art can make various modifications to the embodiments and details of the present invention based on the teachings of the present invention. All these modifications are within the spirit and scope defined by the attached claims.

What is claimed is:

1. A semiconductor device comprising:
   a substrate;
   a first fin disposed on the substrate and including a first semiconductor member;
   a first spacer having a first type of stress and directly contacting the first semiconductor member;
   an insulating layer directly contacting the substrate, wherein the first spacer is positioned between the substrate and a portion of the insulating layer; and
   a second spacer having a second type of stress that is different from the first type of stress, wherein the portion of the insulating layer is positioned between the first spacer and the second spacer, and wherein a side of the first fin directly contacts each of the first spacer and the second spacer.

2. The semiconductor device of claim 1, further comprising:
   a second fin disposed on the substrate and including a second semiconductor member; and
   a third spacer having the second type of stress and directly contacting the second semiconductor member,
   wherein a maximum height of the third spacer with respect to the substrate is less than a maximum height of the second semiconductor member with respect to the substrate.

3. The semiconductor device of claim 2, further comprising a gate enwrapping at least a portion of the first semiconductor member, at least a portion of the first spacer, least a portion of the second semiconductor member, and at least a portion of the third spacer.

4. The semiconductor device of claim 3,
   wherein the first fin further includes a mask, and
   wherein at least a portion of the mask is enwrapped by the gate and is disposed between the first semiconductor and a portion of the gate.

5. The semiconductor device of claim 1, wherein the insulating layer directly contacts the side of the first fin.

6. The semiconductor device of claim 5, further comprising a fourth spacer having the first type of stress, wherein the third spacer is positioned between the substrate and the fourth spacer, and wherein a side of the second fin contacts each of the third spacer and the fourth spacer.

7. The semiconductor device of claim 5, further comprising at least one of a first intermediate layer and a second intermediate layer, the first intermediate layer being disposed between the second spacer and the first spacer and directly contacting at least one of the second spacer and the first spacer, the second intermediate layer being disposed between the second spacer and the insulating layer and directly contacting at least one of the second spacer and the insulating layer.

8. The semiconductor device of claim 1, wherein the first spacer comprises an intermediate layer directly contacting the first semiconductor member.

9. The semiconductor device of claim 1, wherein a maximum height of the first spacer with respect to the substrate is less than a maximum height of the first semiconductor member with respect to the substrate.

10. The semiconductor device of claim 1, further comprising:
    a gate enwrapping at least a portion of the first semiconductor member and contacting the insulating layer.

11. The semiconductor device of claim 1, wherein the maximum height of the first spacer with respect to the substrate is equal to or less than ¾ of the maximum height of the first semiconductor member with respect to the substrate.

12. The semiconductor device of claim 1, wherein the first spacer is formed of compressive stress silicon nitride or tensile stress silicon nitride.

13. A semiconductor device comprising:
    a substrate;
    a first fin disposed on the substrate and including a first semiconductor member;
    a first spacer having a first type of stress and directly contacting the first semiconductor member; and
    a second spacer having a second type of stress that is different from the first type of stress, wherein a side of the first fin directly contacts each of a side of the first spacer and a side of the second spacer, wherein the side of the first spacer is coplanar with the side of the second spacer, and wherein the first spacer is positioned between the substrate and the second spacer and is narrower than the second spacer in a cross-sectional view of the semiconductor device.

14. The semiconductor device of claim 13, wherein the first spacer is narrower than the second spacer in a direction parallel to the substrate.

15. The semiconductor device of claim 1, wherein a first portion of the first spacer is positioned between the substrate and a second portion of the first spacer and is wider than the second portion of the first spacer in a cross-sectional view of the semiconductor device.

16. A semiconductor device comprising:
a substrate;
a fin disposed on the substrate and including a semiconductor member;
a first spacer having a first type of stress, wherein a first side of the first spacer directly or indirectly contacts a first side of the semiconductor member, and wherein a second side of the first spacer directly or indirectly contacts the substrate;
a second spacer having a second type of stress that is different from the first type of stress, wherein a first side of the second spacer directly or indirectly contacts the first side of the semiconductor member, wherein the first side of the first spacer is coplanar with the first side of the second spacer; and
an insulating layer, wherein a first portion of the insulating layer is positioned between the first spacer and the second spacer and directly contacts the first side of the semiconductor member.

17. The semiconductor device of claim 16, wherein the first portion of the insulating layer is positioned between the semiconductor member and a second portion of the insulating layer and is thinner than the second portion of the insulating layer in a direction perpendicular to the substrate.

18. The semiconductor device of claim 17, wherein the second portion of the insulating layer directly contacts the substrate.

19. The semiconductor device of claim 18, wherein the insulating layer directly contacts at least one of the first spacer and the second spacer.

20. The semiconductor device of claim 16, wherein the first spacer is positioned between the substrate and the second spacer, and wherein the second spacer is wider than the first spacer in a direction parallel to the substrate in a cross-sectional view of the semiconductor device.

\* \* \* \* \*